(12) United States Patent
Imbs et al.

(10) Patent No.: US 10,103,079 B2
(45) Date of Patent: Oct. 16, 2018

(54) ELECTRONIC DEVICE PROVIDED WITH AN INTEGRAL CONDUCTIVE WIRE AND METHOD OF MANUFACTURE

(71) Applicants: STMicroelectronics (Alps) SAS, Grenoble (FR); STMicroelectronics (Grenoble 2) SAS, Grenoble (FR)

(72) Inventors: Yvon Imbs, Quaix en Chartreuse (FR); Laurent Schwarz, La Buisse (FR); David Auchere, Meylan (FR); Laurent Marechal, Bures sur Yvette (FR)

(73) Assignees: STMicroelectronics (Alps) SAS, Grenoble (FR); STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/659,078

(22) Filed: Jul. 25, 2017

(65) Prior Publication Data
US 2017/0323841 A1 Nov. 9, 2017

Related U.S. Application Data

(62) Division of application No. 15/050,289, filed on Feb. 22, 2016, now Pat. No. 9,748,159.

(30) Foreign Application Priority Data

Sep. 30, 2015 (FR) ..................................... 15 59251

(51) Int. Cl.
*H01L 23/48* (2006.01)
*H01L 23/31* (2006.01)
(Continued)

(52) U.S. Cl.
CPC ...... *H01L 23/3121* (2013.01); *H01L 21/3105* (2013.01); *H01L 21/56* (2013.01);
(Continued)

(58) Field of Classification Search
CPC .................. H01L 23/3121; H01L 23/3135
USPC ........................................................ 257/774
See application file for complete search history.

(56) References Cited

U.S. PATENT DOCUMENTS

2004/0217472 A1 11/2004 Aisenbrey et al.
2005/0285794 A1 12/2005 Tang et al.
(Continued)

FOREIGN PATENT DOCUMENTS

FR         2780551 A1    12/1999
WO    WO-2010057808 A1    5/2010

OTHER PUBLICATIONS

INPI Search Report and Written Opinion for FR 1559251 dated Jun. 9, 2016 (7 pages).

*Primary Examiner* — Anthony Ho
(74) *Attorney, Agent, or Firm* — Crowe & Dunlevy

(57) ABSTRACT

An electronic device includes a supporting substrate having a front mounting face and an electrical connection network. An integrated circuit chip is mounted to the mounting face and is electrically connected to the electrical connection network. A primary encapsulation block embeds the integrated circuit chip and extends above and around the integrated circuit chip on the mounting face of the supporting substrate. An opening is provided in the primary encapsulation block to at least partially uncover an electrical contact. An additional wire made from an electrically conductive material has an end that is electrically connected to the electrical contact. An additional encapsulation block above the primary encapsulation block embeds the additional wire.

12 Claims, 4 Drawing Sheets

(51) Int. Cl.

|  |  |
|---|---|
| *H01L 21/56* | (2006.01) |
| *H01L 21/768* | (2006.01) |
| *H01L 21/3105* | (2006.01) |
| *H01L 23/498* | (2006.01) |
| *H01L 23/66* | (2006.01) |
| *H01L 23/00* | (2006.01) |

(52) U.S. Cl.
CPC .. *H01L 21/76802* (2013.01); *H01L 21/76877* (2013.01); *H01L 23/3135* (2013.01); *H01L 23/481* (2013.01); *H01L 23/49811* (2013.01); *H01L 23/49838* (2013.01); *H01L 23/66* (2013.01); *H01L 24/48* (2013.01); *H01L 24/85* (2013.01); *H01L 2223/6611* (2013.01); *H01L 2223/6677* (2013.01); *H01L 2224/16225* (2013.01); *H01L 2224/48227* (2013.01); *H01L 2224/48235* (2013.01); *H01L 2224/73257* (2013.01); *H01L 2224/8538* (2013.01); *H01L 2924/00012* (2013.01); *H01L 2924/14* (2013.01); *H01L 2924/15311* (2013.01); *H01L 2924/181* (2013.01); *H01L 2924/19107* (2013.01)

(56) References Cited

U.S. PATENT DOCUMENTS

| | | |
|---|---|---|
| 2008/0184550 A1 | 8/2008 | Hwan et al. |
| 2009/0289343 A1 | 11/2009 | Chiu et al. |
| 2011/0049686 A1 | 3/2011 | Yun et al. |
| 2012/0062439 A1 | 3/2012 | Liao et al. |
| 2013/0009320 A1 | 1/2013 | Yoo et al. |
| 2013/0087895 A1 | 4/2013 | Upadhyayula et al. |
| 2015/0102500 A1 | 4/2015 | Coffy et al. |

ELECTRONIC DEVICE PROVIDED WITH AN INTEGRAL CONDUCTIVE WIRE AND METHOD OF MANUFACTURE

CROSS REFERENCE TO RELATED APPLICATIONS

This application is a divisional application of U.S. application for patent Ser. No. 15/050,289 filed Feb. 22, 2016, which claims priority from French Application for Patent No. 1559251 filed Sep. 30, 2015, the disclosures of which are incorporated by reference.

TECHNICAL FIELD

The present invention concerns the field of electronic devices.

BACKGROUND

Known electronic devices, generally of parallelepiped shape, include a supporting substrate, including an electrical connection network, an integrated circuit chip mounted on one of the faces of the supporting substrate and an encapsulation block in which the chip is embedded. The chip is connected to the network of the supporting substrate by electrical connection elements such as balls, disposed between the supporting substrate and the chip, or by electrical connection wires embedded in the encapsulation block.

Such electronic devices are mounted on printed circuit boards, generally via electrical connection elements such as balls, connecting the electrical connection network of the supporting substrates and the electrical connection network of the printed circuit boards.

When the chips generate radio signals that have to be transmitted or process received radio signals, the sending or receiving antennas are produced on the printed circuit boards. The electrical signals follow very long resistive paths that consist of lines of the electrical connection network of the printed circuit boards, the electrical connection elements between the printed circuit boards and the supporting substrates, lines of the electrical connection network of the supporting substrates and the electrical connection elements between the supporting substrates. Such paths also depend on the quality of the interconnections resulting from the process of manufacture.

The above arrangements constitute a handicap, notably when the necessary size of the antennas for the transmission of radio signals at frequencies of the order of 1 GHz and above, and even very much higher than 1 GHz, is small.

SUMMARY

There is proposed an electronic device including a supporting substrate having a front mounting face and including an electrical connection network and at least one integrated circuit chip mounted on said mounting face of the supporting substrate and electrically connected to said electrical connection network.

The device also includes an encapsulation block including a primary encapsulation block in which the chip is embedded and which extends above and around the chip on said mounting face of the supporting substrate, and an additional encapsulation block above the primary block.

The device further includes at least one additional wire made from an electrically conductive material embedded in said additional encapsulation block, this additional conductive wire being electrically connected to said chip and/or to said electrical connection network.

At least one of the ends of the additional conductive wire may be connected to at least one electrical contact on said mounting face of said supporting substrate at a distance from the periphery of the chip.

At least one of the ends of the additional conductive wire may be connected to at least one electrical contact on a front face of said chip.

The device may include a pillar above an electrical contact on said mounting face of said supporting substrate, through said primary encapsulation block, one end of said additional conductive wire being fixed to this pillar.

The device may include a pillar above an electrical contact on a front face of said chip, through said primary encapsulation block, one end of said additional conductive wire being fixed to this pillar.

One of the ends of said additional wire may be fixed to said primary encapsulation block.

Said additional conductive wire may constitute a radio antenna or an electrical connection.

There is also proposed a method of manufacturing an electronic device in which there are procured a primary electronic device including a supporting substrate, an integrated circuit chip mounted on a front mounting face of the supporting substrate and a primary encapsulation block extending above and around the chip on said mounting face of the supporting substrate, the encapsulation block having a front face parallel to the supporting substrate.

The method includes producing at least one hole said through primary encapsulation block of the primary electronic device, from its front face, until there is at least partly uncovered an electrical contact of said mounting face of said supporting substrate and/or a front face of the chip; installing at least one electrically conductive wire above the primary encapsulation block and in a position such that one of the ends of this electrically conductive wire is connected to said electrical contact; and producing an additional encapsulation block on said primary encapsulation block of said primary electronic device, the conductive wire being embedded in this additional encapsulation block.

The method may include: producing in said hole a pillar made of an electrically conductive material; and fixing one end of the conductive wire to this pillar.

The method may include: fixing at least one of the ends of the conductive wire directly above said electrical contact.

The method may include: fixing one of the ends of the conductive wire to said primary encapsulation block.

In an embodiment, a method comprises: opening a hole in a first encapsulation block, said hole extending for a depth sufficient to at least partly uncover an electrical contact; installing an electrically conductive wire in a position where the electrically conductive wire is electrically connected to the electrical contact and further extends over and without physically contacting a top surface of the first encapsulation block; and producing a second encapsulation block in contact with the top surface of the first encapsulation block and embedding the electrically conductive wire

BRIEF DESCRIPTION OF THE DRAWINGS

Electronic devices and their method of manufacture will now be described by way of embodiments illustrated by the drawing, in which.

DETAILED DESCRIPTION

Figure 1:
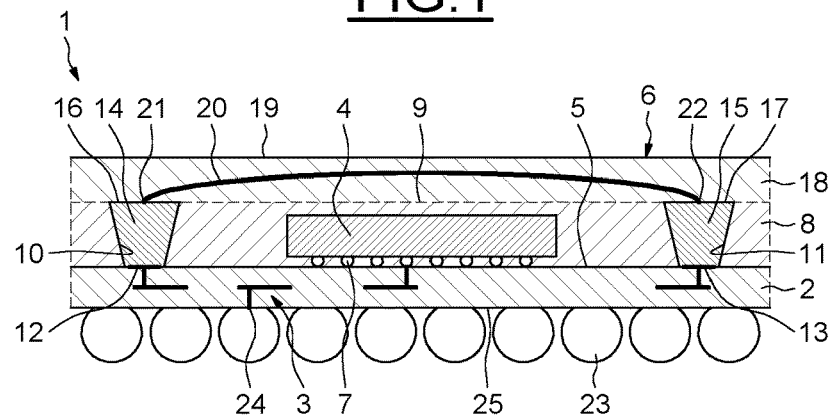
FIG. 1 represents a section of an electronic device.
Figure 2:
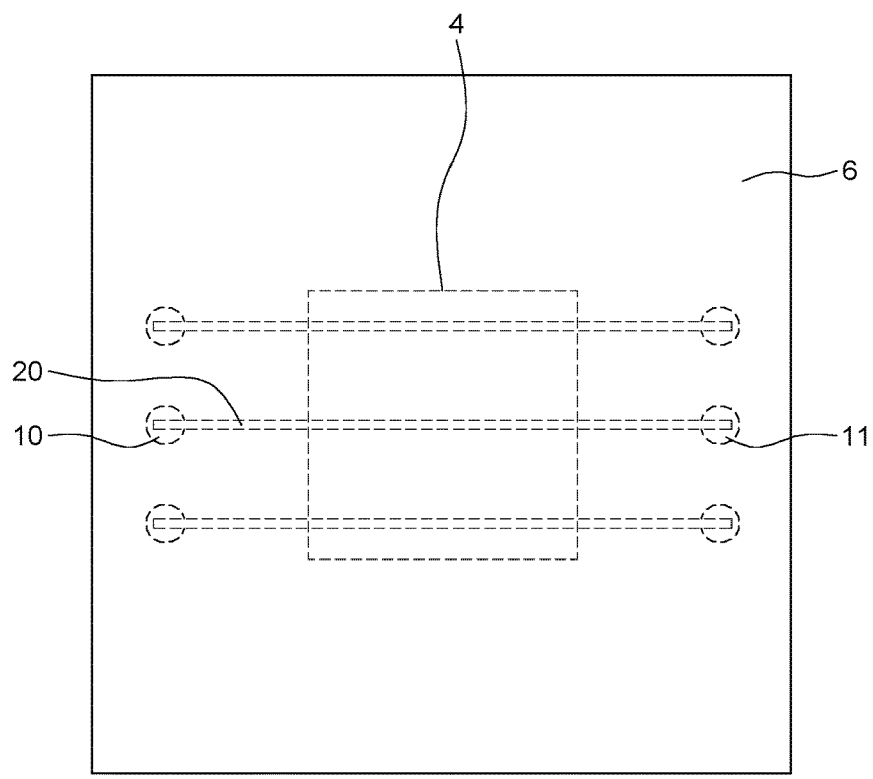
FIG. 2 represents a top view of the electronic device from FIG. 1.

As shown in FIGS. 1 and 2, in accordance with one embodiment, a final electronic device 1 includes a supporting substrate 2 including an integrated electrical connection network 3, an integrated circuit chip 4 mounted on a front mounting face 5 of the supporting substrate 2 and a final encapsulation block 6 that extends over and around the chip 4 on the mounting face 5 of the supporting substrate 2 so that the electronic device 1 takes the form of a parallelepiped.

In accordance with one variant embodiment represented, the integrated circuit chip 4 is mounted on the mounting face 5 of the supporting substrate 2 by means of electrical connection elements 7, such as balls, that selectively connect the chip 4 and the electrical connection network 3. In accordance with another variant embodiment, the chip 4 could be glued to the mounting face 5 of the supporting substrate 2 and connected to the electrical connection network 3 by electrical connection wires embedded in the encapsulation block 6.

The encapsulation block 6 includes a primary encapsulation block 8 in which the chip 4 is embedded and which extends over and around the chip 4 on the mounting face 5 of the supporting substrate 2 so as to have a front face 9 parallel to the supporting substrate 2.

The primary encapsulation block 8 has holes 10 and 11 extending through it from the front face 9, arranged over front electrical contacts 12 and 13 of the network 3, arranged on the front face 5 of the supporting substrate 2, at a distance from the chip 4. The through-holes 10 and 11 are arranged on either side of the chip 4, for example.

The through-holes 10 and 11 contain metal electrical connection pillars 14 and 15 formed on the electrical contacts 12 and 13 and having front faces 16 and 17.

The final encapsulation block 6 includes an additional encapsulation block 18 on top of the primary encapsulation block 8, covering the front face 9 of the primary encapsulation block 8 and the front faces 16 and 17 of the conductive pillars 14 and 15, this additional encapsulation block 18 having a front face 19 parallel to the substrate board.

The final electronic device 1 further includes an integrated additional electrical wire 20 that is embedded in the additional encapsulation block 18 and has ends 21 and 22 fixed by soldering them to the front faces 16 and 17 of the pillars 14 and 15, respectively. The electrical wire 20 extends between and at a distance from the interface 9 and the front face 19 of the final encapsulation block 6.

The electronic device 1 may be provided with exterior electrical connection elements 23, such as balls, disposed on electrical contacts 24 of the electrical connection network 3 arranged on a rear face 25 of the supporting substrate 2, opposite the mounting face 5.

The electronic device 1 may be manufactured in the following manner, using the usual means employed in microelectronics.

Figure 3:
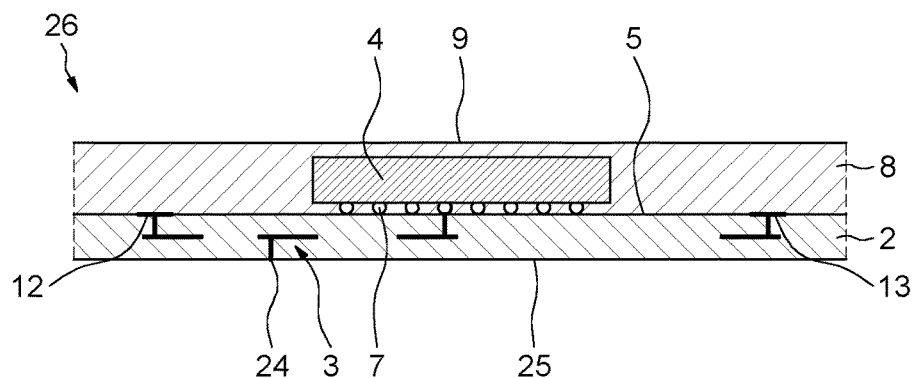
FIG. 3 represents in section a step in the manufacture of the electronic device from FIG. 1.

As shown in FIG. 3, a prefabricated primary electronic device 26 is procured that includes the supporting substrate 2 provided with the integrated connection network 3, the chip 4, the connection elements 7 and the primary encapsulation block 8.

Figure 4:
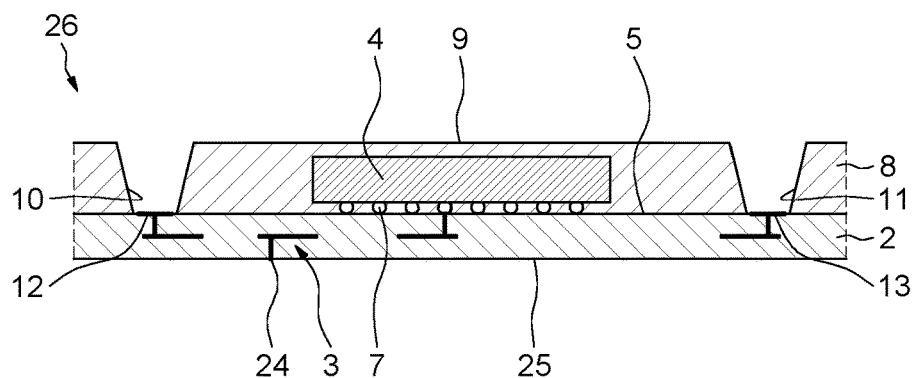
FIG. 4 represents in section another step in the manufacture of the electronic device from FIG. 1.

As shown in FIG. 4, the holes 10 and 11 are made through the primary encapsulation block 8 so as to uncover the front electrical contacts 12 and 13.

Figure 5:
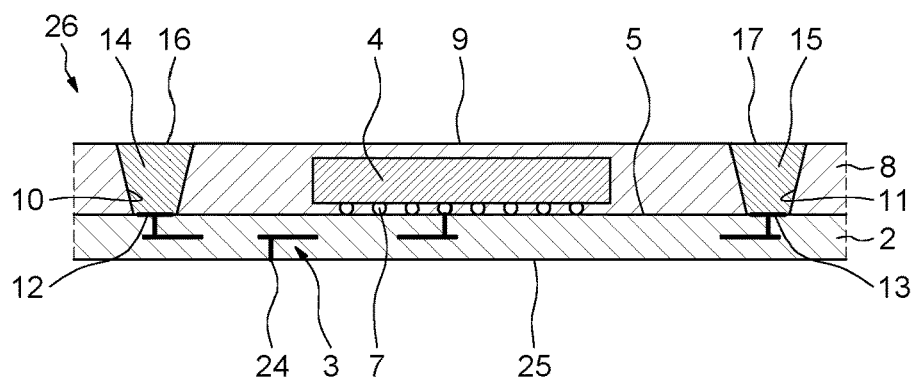
FIG. 5 represents in section another step in the manufacture of the electronic device from FIG. 1.

As shown in FIG. 5, the pillars 14 and 15 are produced in the holes 10 and 11, for example by growing a metal deposit. The height of the pillars 14 and 15 may be less than, equal to or greater than the depth of the holes 10 and 11.

Figure 6:
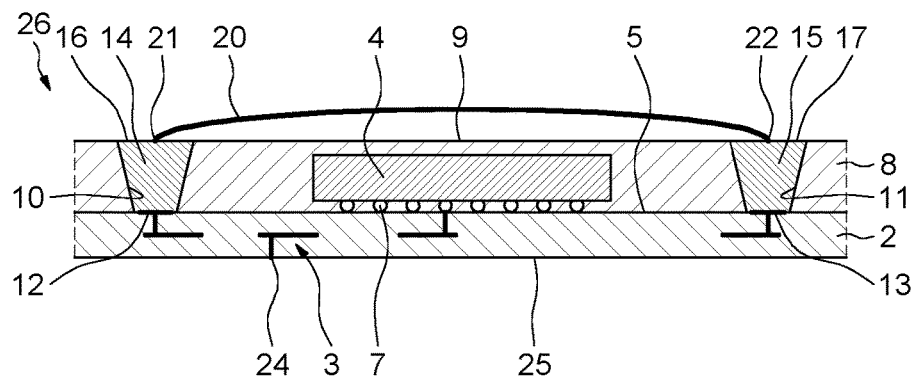
FIG. 6 represents in section another step in the manufacture of the electronic device from FIG. 1.

As shown in FIG. 6, the electrical wire 20 is placed on top of the primary encapsulation block 8 with its ends soldered to the front surfaces 16 and 17 of the pillars 14 and 15. A standard wire bonding machine may be used for this. It is necessary for the hardness of the pillars 14 and 15 to be compatible with receiving the ends of the electrical wire 20 soldered to the front surfaces 16 and 17. The diameter of the electrical wire 20 may be between 15 and 50 microns, for example. The electrical wire 20 may be made of gold or of an alloy based on silver, copper or aluminum.

Figure 7:
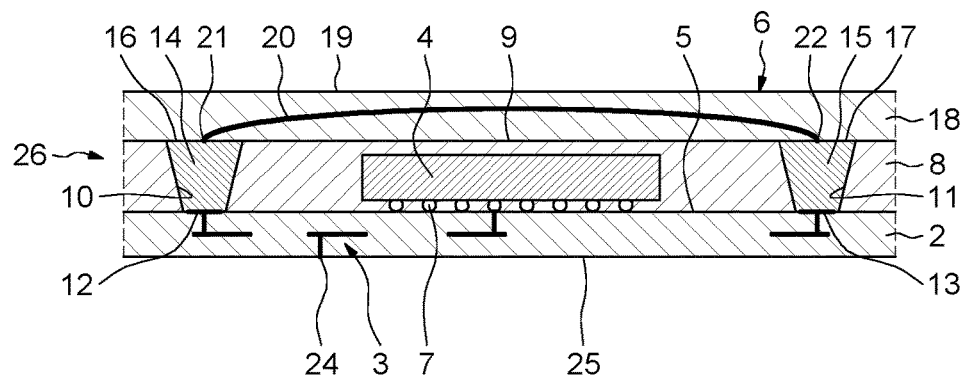
FIG. 7 represents in section another step in the manufacture of the electronic device from FIG. 1.

As shown in FIG. 7, the additional encapsulation block 18 is produced on top of the primary encapsulation block 8 so as to embed the electrical wire 20.

The exterior electrical connection elements 23 are fitted.

The electronic device 1 shown in FIG. 1 is finally obtained.

As shown in FIG. 2, the electronic device 1 may include a plurality of electrical wires 20 embedded in the additional block 18, and for example parallel, connected to corresponding pillars 14 and 15 arranged on corresponding electrical contacts 12 and 13 passing through the primary encapsulation block 8. The various holes and the various pillars may be produced and the placing of the electrical wires may be carried out simultaneously during successive operations as described with reference to FIGS. 3 to 7.

Figure 8:
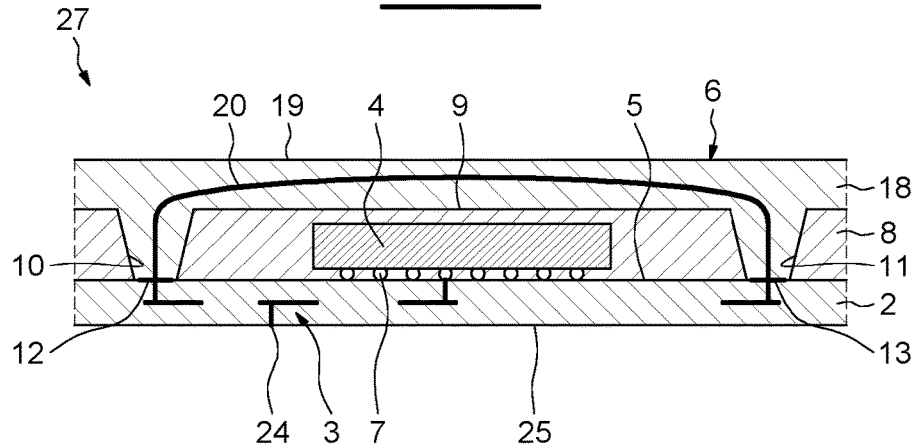
FIG. 8 represents a section of another electronic device.

In accordance with another embodiment shown in FIG. 8, an electronic device 27 differs from the electronic device 1 only in that the electrical connection pillars 14 and 15 exist. This time, the end portions of the electrical wire 20 are engaged in the through-holes 10 and 11 and the ends of the electrical wire 2 are fixed directly to the electrical contacts 12 and 13. Moreover, the additional encapsulation block 18 fills the through-holes 10 and 11.

Consequently, to produce the electronic device 27 the step described with reference to FIG. 7 is omitted. The electrical wire 20 is mounted directly after producing the holes 10 and 11. It is necessary for the holes 10 and 11 and the head of the wire bonding machine that places the electrical wire 20 have reciprocal dimensions adapted for this placement.

Figure 9:
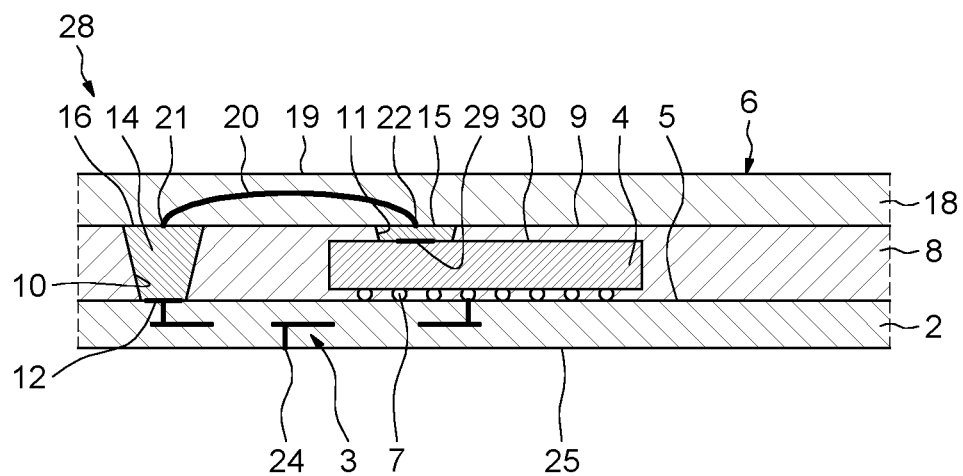
FIG. 9 represents a section of another electronic device.

In accordance with another embodiment shown in FIG. 9, an electronic device 28 differs from the electronic device 1 in that the electronic connection pillar 15 is produced on top of a specific electrical contact 29 of the front face 30 of the chip 4, in a through-hole 11 situated above this chip 4. The specific electrical contact 29 may be the result of forming an electrical connection through the substrate of the integrated circuit chip 4 known as a TSV (Through Silicon Via).

In accordance with another embodiment, the ends of the electrical wire 20 could be connected to respective pillars produced on two electrical contacts on the front face 30 of the chip 4.

As in the FIG. 8 example, in these examples described with reference to FIG. 9, the pillars could be omitted.

Figure 10:
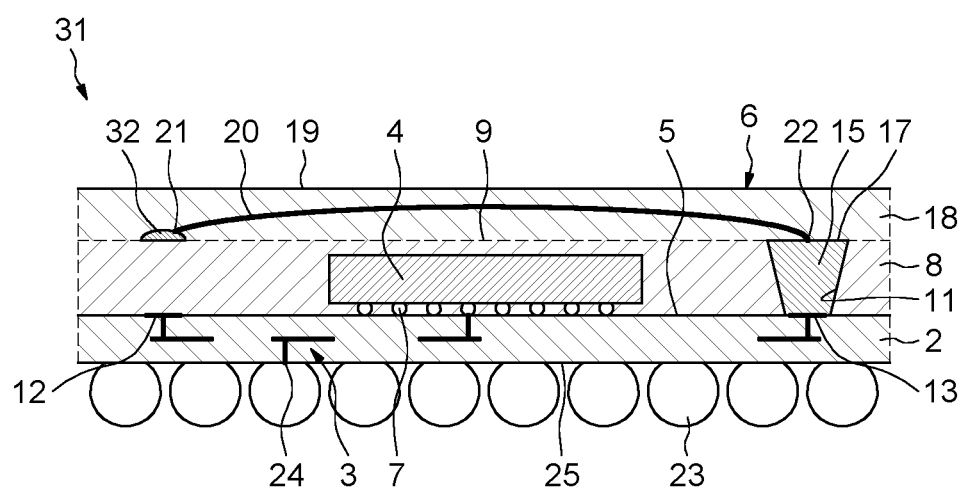
FIG. 10 represents a section of another electronic device.

In accordance with another embodiment shown in FIG. 10, an electronic device 31 differs from the electronic device 1 in that the end 21 of the additional conductive wire 20 is not fixed to a pillar but is fixed to the front face 9 of the primary encapsulation block 8 by means of a drop 32 of glue embedded in the additional encapsulation block 18 so that this end 21 of the additional conductive wire 20 is electrically floating. This arrangement could also constitute a variant embodiment of the electronic device 28 described with reference to FIG. 9.

The electronic devices that have just been described may be manufactured collectively on a common supporting wafer, as known in the field of microelectronics. The primary and additional encapsulation blocks may be obtained by spreading a liquid material, for example an epoxy resin, and then hardening that material.

In accordance with one application example, the electrical wire 20 may constitute a radio antenna for transmitting/receiving radio signals at very high frequencies (of the order of 1 GHz or above, or even very much higher than 1 GHz), connected to the chip 4 by short electrical connection paths via the electrical connection network of the supporting substrate 2.

In accordance with another application example, one of the electrical contacts may not be connected to an electrical component and therefore be electrically floating.

In accordance with another application example, the electrical wire 20 may constitute a specific electrical connection of the circuits of the chip 4, either directly or via the electrical connection network 3 or a specific exterior electrical connection of the chip 4 via the electrical connection network.

The invention claimed is:

1. A method, comprising the following steps performed in the recited order:
   producing a hole that extends into a primary encapsulation block which encapsulates a primary electronic device including a supporting substrate and an integrated circuit chip mounted on a front mounting face of the supporting substrate, said hole at least partly uncovering an electrical contact;
   installing at least one electrically conductive wire above the primary encapsulation block and in a position such that one end of the electrically conductive wire is electrically connected to said electrical contact; and
   producing an additional encapsulation block on said primary encapsulation block, the additional encapsulation block embedding the electrically conductive wire.

2. The method according to claim 1, further comprising:
   producing a pillar made of an electrically conductive material in said hole;
   wherein installing comprises fixing said one end of the electrically conductive wire to said pillar.

3. The method according to claim 2, wherein the electrical contact is a contact on the front mounting face of the supporting substrate.

4. The method according to claim 2, wherein the electrical contact is a contact on the integrated circuit chip.

5. The method according to claim 1, wherein the electrical contact is a contact on the front mounting face of the supporting substrate, said one end of the electrically conductive wire extending into said hole to make contact with the electrical contact.

6. The method according to claim 1, further comprising fixing another end of the electrically conductive wire to said primary encapsulation block.

7. A method, comprising the following steps performed in the recited order:
   opening a hole in a first encapsulation block, said hole extending for a depth sufficient to at least partly uncover an electrical contact;
   installing an electrically conductive wire in a position where the electrically conductive wire is electrically connected to the electrical contact and further extends over and without physically contacting a top surface of the first encapsulation block; and
   producing a second encapsulation block in contact with the top surface of the first encapsulation block and embedding the electrically conductive wire.

8. The method of claim 7, further comprising:
   completely filling said hole with an electrically conductive fill; and
   making an electrical connection between an end of the electrically conductive wire and the electrically conductive fill.

9. The method of claim 8, wherein the electrical contact is a contact on a front mounting face of a supporting substrate to which the first encapsulation block is mounted.

10. The method of claim 8, wherein the electrical contact is a contact on a surface of an integrated circuit chip which is encapsulated within the first encapsulation block.

11. The method of claim 7, wherein an end of the electrically conductive wire extends into the hole and is physically connected to the electrical contact.

12. The method of claim 7, wherein a first end of the electrically conductive wire is electrically connected to the electrical contact and further comprising mounting a second end of the electrically conductive wire to the top surface of the first encapsulation block, where a portion of the electrically conductive wire between the first and second ends is separated from the top surface of the first encapsulation block and embedded within the second encapsulation block.

* * * * *